(12) United States Patent
Schmidt

(10) Patent No.: US 9,396,516 B2
(45) Date of Patent: Jul. 19, 2016

(54) METHOD AND APPARATUS FOR DISPLAYING ORDINATE ABSCISSA VALUE PAIRS ON A DISPLAY DEVICE

(71) Applicant: Rohde & Schwarz GmbH & Co. KG, Munich (DE)

(72) Inventor: David Schmidt, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 29 days.

(21) Appl. No.: 14/381,548

(22) PCT Filed: Feb. 15, 2013

(86) PCT No.: PCT/EP2013/053069
§ 371 (c)(1),
(2) Date: Aug. 27, 2014

(87) PCT Pub. No.: WO2013/127644
PCT Pub. Date: Sep. 6, 2013

(65) Prior Publication Data
US 2015/0009235 A1    Jan. 8, 2015

(30) Foreign Application Priority Data

Feb. 27, 2012    (DE) .......................... 10 2012 202 941

(51) Int. Cl.
*G06T 3/00*    (2006.01)
*G01R 13/02*    (2006.01)
*G06T 11/20*    (2006.01)

(52) U.S. Cl.
CPC ................ *G06T 3/00* (2013.01); *G01R 13/029* (2013.01); *G06T 11/206* (2013.01)

(58) Field of Classification Search
CPC ........... G06T 15/005; G09G 2340/125; G09G 5/395; H04N 9/641; B82Y 10/00
See application file for complete search history.

(56) References Cited

U.S. PATENT DOCUMENTS

2010/0013834 A1* 1/2010 Schmidt ............... G01R 13/029
345/440
2010/0194377 A1    8/2010 Valenti

FOREIGN PATENT DOCUMENTS

CH    CN101183458 A  *  5/2008  ................ G06T 1/00
DE    102006047994 A1    4/2008

(Continued)

OTHER PUBLICATIONS

"International Preliminary Report on Patentability (translation)", PCT/EP2013/053069, Sep. 12, 2014.

*Primary Examiner* — Todd Buttram
(74) *Attorney, Agent, or Firm* — Potomac Technology Law, LLC

(57) ABSTRACT

An apparatus for displaying ordinate-abscissa value pairs with discrete display points in the abscissa and ordinate directions determines an interpolated ordinate value at half the abscissa spacing between the respective abscissa value and the respective abscissa value of the display points to the left and right. A maximum ordinate value and a minimum ordinate value are then determined from the ordinate value of the respective ordinate-abscissa value pair, and the respectively interpolated ordinate values on the left and right. A random or pseudo-random ordinate value is then selected between the determined maximum and minimum ordinate values for every abscissa value of the display points. The ordinate resolution of the display points is thus reduced by comparison with the ordinate resolution of the ordinate-abscissa value pairs.

14 Claims, 6 Drawing Sheets

(56) References Cited

FOREIGN PATENT DOCUMENTS

| EP | 0209226 | A2 | 1/1987 |
| EP | 0919818 | A1 | 6/1999 |
| EP | 0937987 | A2 | 8/1999 |
| WO | WO9637785 | A1 | 11/1996 |

* cited by examiner ly, $N_{FFT}=2048$—and a resolution in the ordinate direction at the level of the word width of the logarithmic amplifier 5—typically $2^{16}=56636$ level steps. Since the resolution of the measured values to be displayed is greater in both the abscissa direction and also the ordinate direction than the resolution of the display device 6, the resolution of the measured values to be displayed must be reduced before implementing the display of the measured values on the display device 6.

METHOD AND APPARATUS FOR DISPLAYING ORDINATE ABSCISSA VALUE PAIRS ON A DISPLAY DEVICE

CROSS-REFERENCE TO RELATED APPLICATION(S)

The present application is a national phase application of PCT application No. PCT/EP2013/053069 (filed Feb. 15, 2013), and claims priority to German Patent Application No. DE 102012202941.9 (filed Feb. 27, 2012), the entireties of which are incorporated herein by reference.

BACKGROUND

The invention relates to a method and apparatus for displaying ordinate-abscissa value pairs on a display device.

For the graphic display of measured values in measuring devices or systems, for example, in spectrum analyzers or network analyzers, display devices with discrete display points—pixel graphics—are used as standard. The resolution of such display devices is restricted because of the limited number of display points in the ordinate direction and abscissa direction. The maximum resolution of such display devices is currently, for example, around 1000*600 display points.

A spectrum analyzer as shown in FIG. 1 comprises, for example, a low-pass filter 1 for frequency limitation of the signal to be displayed, an analog-digital converter 2 for digitizing the signal to be displayed, a Fast Fourier Transformer 3 (FFT) for calculating the discrete Fourier spectral lines by fast Fourier transform, a modulus-former 4 for determining the power spectral lines, a logarithmic amplifier 5 for compressing the power spectral lines scattering over a broad signal range to the display range of the display device, and a display device 6 with discrete display points in the ordinate direction and abscissa direction for the display of the discrete power spectral lines. The power spectrum to be displayed provides a resolution in the abscissa direction at the level of the FFT length $N_{FFT}$ of the FFT transformer 3—typical- Reducing the resolution of the measured values to be displayed in the abscissa direction disadvantageously leads to a loss of information of the measured values to be displayed in the ordinate direction. Strong fluctuations of the measured values to be displayed over a relatively large value range in the ordinate direction accordingly lead to an unacceptable error in accuracy, especially in the case of real-time data collection and display.

A method for displaying ordinate-abscissa value pairs on a display device which provides a lower resolution in the ordinate direction and abscissa direction than the resolution of the ordinate-abscissa value pairs is known from DE 2006 047 994 A1. To minimize the loss of information in the display of the ordinate-abscissa value pairs resulting from a reduced resolution of the display device, abscissa ranges are defined in each case which extend from an abscissa-range limit on the left, at half the spacing between the respective abscissa value and the respective, adjacent abscissa value on the left of the display device up to, respectively, an abscissa-range limit on the right, at half the spacing between the respective abscissa value and the adjacent abscissa value on the right. Interpolated ordinate values are calculated by interpolation at the individual abscissa-range limits. For each abscissa range, a maximum and a minimum ordinate value is determined in each case from all of the ordinate values disposed within the abscissa range with the addition of the interpolated ordinate values at the abscissa-range limits. As shown in FIG. 2, within each abscissa range, the display device described in DE 10 2006 047 994 A1 contains an area, in each case, between the two abscissa-range limits and the determined maximum and minimum ordinate value.

The method described in DE 10 2006 047 994 A1 does not generate any frequency of distribution values in a histogram display. A triggering in response to frequencies of distribution is therefore not possible. Moreover, such a signal evaluation and display is not suitable for signals with a given background noise (noise carpet), because the display of areas by comparison with a display of accumulations of points is a non-typical and unnatural form of display for background noise. Moreover, as a result of the method, in the histogram display of a sinusoidal base signal with superposed background noise, as shown in FIG. 3, the maximum for the frequency of distribution of the background noise is displaced downwards by a few decibels by comparison with a correct display.

In a dot display, as shown in FIG. 4, only the individual measured ordinate values at the individual abscissa values are registered without calculation of additional interpolated ordinate values and converted to ordinate-abscissa value pairs in the resolution of the display device. Accordingly, in a histogram display with constant spectral components with steep edges as shown in FIG. 5, for example, in the case of a sinusoidal signal component occurring as a spectral line, only unconnected collections of dots are displayed, which are more difficult to identify for the observer than interpolated signal characteristics.

What is needed, therefore, is an approach for displaying ordinate-abscissa value pairs on a display device with a lower resolution in the abscissa direction and in the ordinate direction by comparison with the resolution of the ordinate-abscissa value pairs, which, especially in the case of a histogram display, does not lead to a curve characteristic which is error-laden and/or difficult to identify.

SUMMARY

Embodiments of the present invention advantageously address the foregoing requirements and needs, as well as others, by providing an approach for displaying ordinate-abscissa value pairs on a display device with a lower resolution in the abscissa direction and in the ordinate direction by comparison with the resolution of the ordinate-abscissa value pairs, which, especially in the case of a histogram display, does not lead to a curve characteristic which is error-laden and/or difficult to identify.

With regard to the description of the present specification, for clarity and convenience, the abscissa resolution of the display device in the following description corresponds to the abscissa resolution of the measured values. The operational case of a relatively higher abscissa resolution of the measured values, which would require a reduction of the abscissa resolution in the signal processing of the measuring device, would be readily apparent to one of skill in the art and is thus not included in the following description.

According to example embodiments of the invention, additional interpolated ordinate values are determined for the measured ordinate values at the individual abscissa values in the half spacing intervals between the individual abscissa values, and in each case, for every abscissa value, the maximum ordinate value and the minimum ordinate value is determined from the ordinate value measured for each abscissa value and the two nearest, adjacent interpolated ordinate values on the left and on the right. Finally, in each case for every abscissa value, a random or pseudo-random ordinate value is determined, which is disposed within the maximum and minimum ordinate-value interval determined for the respective abscissa value.

In this context, it should be noted that the random or pseudo-random ordinate value between respectively successive abscissa values originates from ordinate ranges between maximum and minimum ordinate value, which, by way of example, are disposed at a relatively far distance from one another. Since several signal characteristics disposed in time succession relative to one another are typically processed and displayed together in a single display image, the random or pseudo-random ordinate values in the case of a respectively identical abscissa value in each case between two signal characteristics disposed in time succession relative to one another should be selected in such a manner that they also originate from ordinate ranges between maximum and minimum ordinate value disposed as far as possible from one another.

Finally, the minimum ordinate spacing in each case between two random or pseudo-random ordinate values should correspond to the minimum interval between two ordinate values of the registered ordinate-abscissa value pairs following one another in the ordinate direction, in order to avoid un-defined ordinate values in the display image of the display device and therefore gaps in the curve characteristic on the display image.

By way of example, the selection of a random or pseudo-random ordinate value for every abscissa value may be implemented by difference formation between the maximum and minimum ordinate value determined respectively for each abscissa value, by determining an associated random or pseudo-random scaling factor between zero and one, by multiplying the determining difference by the associated random or pseudo-random scaling factor and by subsequently adding the difference between maximum and minimum ordinate value to the minimum ordinate value multiplied by the random or pseudo-random scaling factor.

By way of further example, the random or pseudo-random scaling factor for determining a random or pseudo-random ordinate value for every abscissa value may be determined in a quasi-deterministic manner. According to one embodiment, for this purpose, a counter initialized at an initialization time is incremented for every display image to be displayed and the associated abscissa value is added in each case to the counter status of the counter for every abscissa value. For the quasi-deterministic generation of a random or pseudo-random scaling factor, the individual bits of the counter status of the counter increased by the abscissa value are diametrically exchanged. After the diametrical exchange, the original first bit, for example, is disposed at the position of the last bit, and the original last bit is disposed at the position of the first bit. In this manner, the counter statuses respectively associated with successive abscissa values no longer provide the minimum spacing from a bit, but are spaced as far as possible from one another as a result of the bit exchange.

By way of further example, if several signal characteristics are additionally processed and displayed in parallel, a maximum possible spacing between the random or pseudo-random scaling factors, which are associated in each case with two successive signal characteristics in the case of an identical abscissa value, can be achieved in such a manner that the counter status of the counter before the addition of the abscissa value is displaced to the left by a number of displacement steps which corresponds to the log-2 value of the number of signal characteristics processed in parallel. Following this, the counter status of the counter displaced to the left is increased by a value corresponding to the position of the respective signal characteristic to be displayed in the sequence of sequentially registered signal characteristics to be processed in parallel. The subsequent diametrical exchange of the bits of the accordingly modified counter status after the addition of the abscissa value therefore provides, in each case, random or pseudo-random scaling factors, which differ from one another as far as possible for two successive signal characteristics with an identical abscissa value.

By way of further example, the random or pseudo-random ordinate value determined for every abscissa value, which results from the multiplication of the random or pseudo-random scaling factor by the difference between the maximum and minimum ordinate value and a subsequent addition of the minimum ordinate value, may be supplied for a quantization, in which the random or pseudo-random ordinate value is converted into an ordinate value with the ordinate resolution of the display device. Optionally, within the framework of an enlargement function (zoom function), a given, coherent excerpt of ordinate-abscissa value pairs can be selected from all of the ordinate-abscissa value pairs with the associated random or pseudo-random ordinate values and then converted by means of quantization to the display points of the display device.

BRIEF DESCRIPTION OF THE DRAWINGS

Various example embodiments according to the invention are explained in detail below with reference to the drawings, wherein like components are labeled with the same reference numbers, and in which.

DETAILED DESCRIPTION

Approaches for displaying ordinate-abscissa value pairs on a display device with a lower resolution in the abscissa direction and in the ordinate direction by comparison with the resolution of the ordinate-abscissa value pairs, which, especially in the case of a histogram display, does not lead to a curve characteristic which is error-laden and/or difficult to identify, are described. In the following description, for the purposes of explanation, numerous specific details are set forth in order to provide a thorough understanding of the invention. It is apparent, however, that embodiments of the invention may be practiced without these specific details or with an equivalent arrangement. In other instances, well known structures and devices are shown in block diagram form in order to avoid unnecessarily obscuring the invention.

Figure 8:
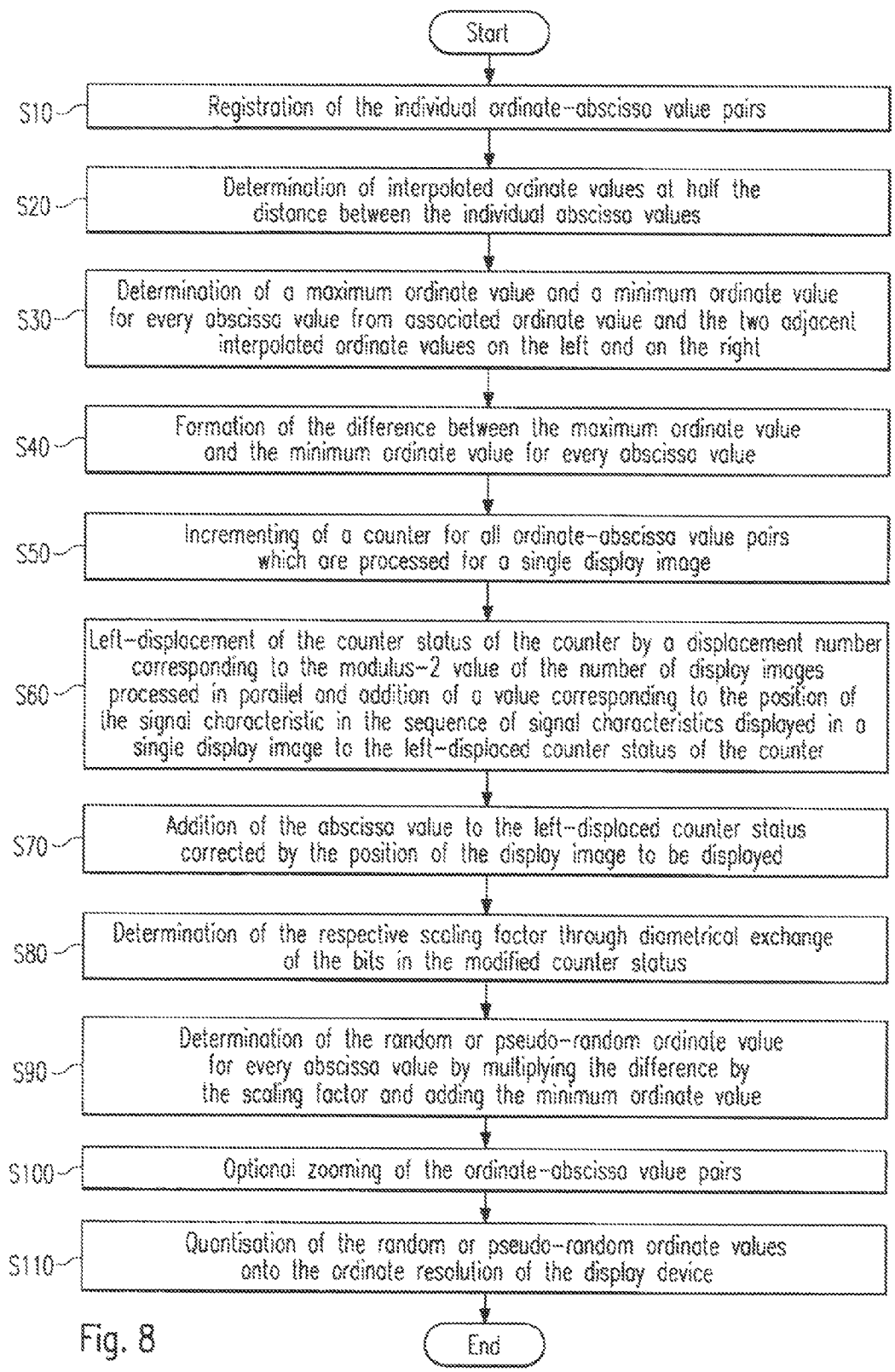
FIG. 8 illustrates a flow chart depicting a method for displaying ordinate-abscissa value pairs on a display device, according to example embodiments of the present invention.
Figure 9A:
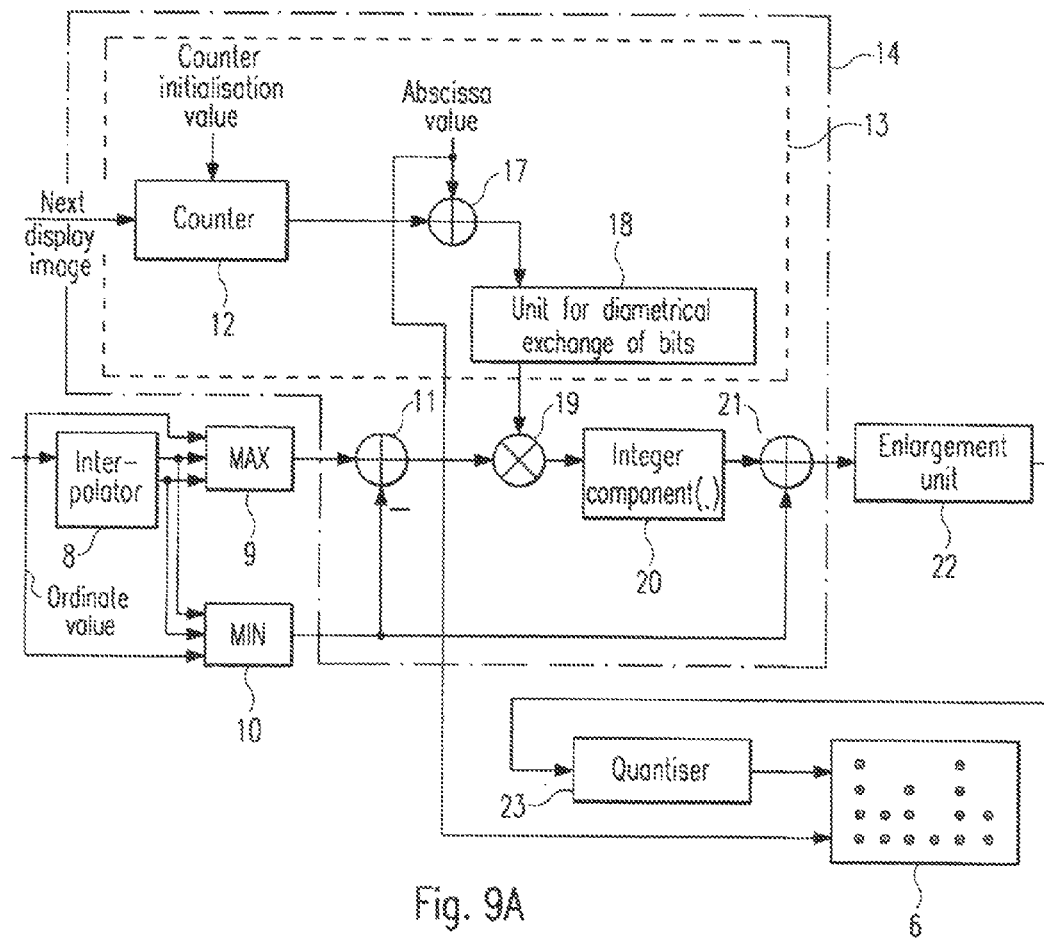
FIG. 9A illustrates a block-circuit diagram of a first apparatus for displaying ordinate-abscissa value pairs on a display device, according to example embodiments of the present invention.
Figure 9B:
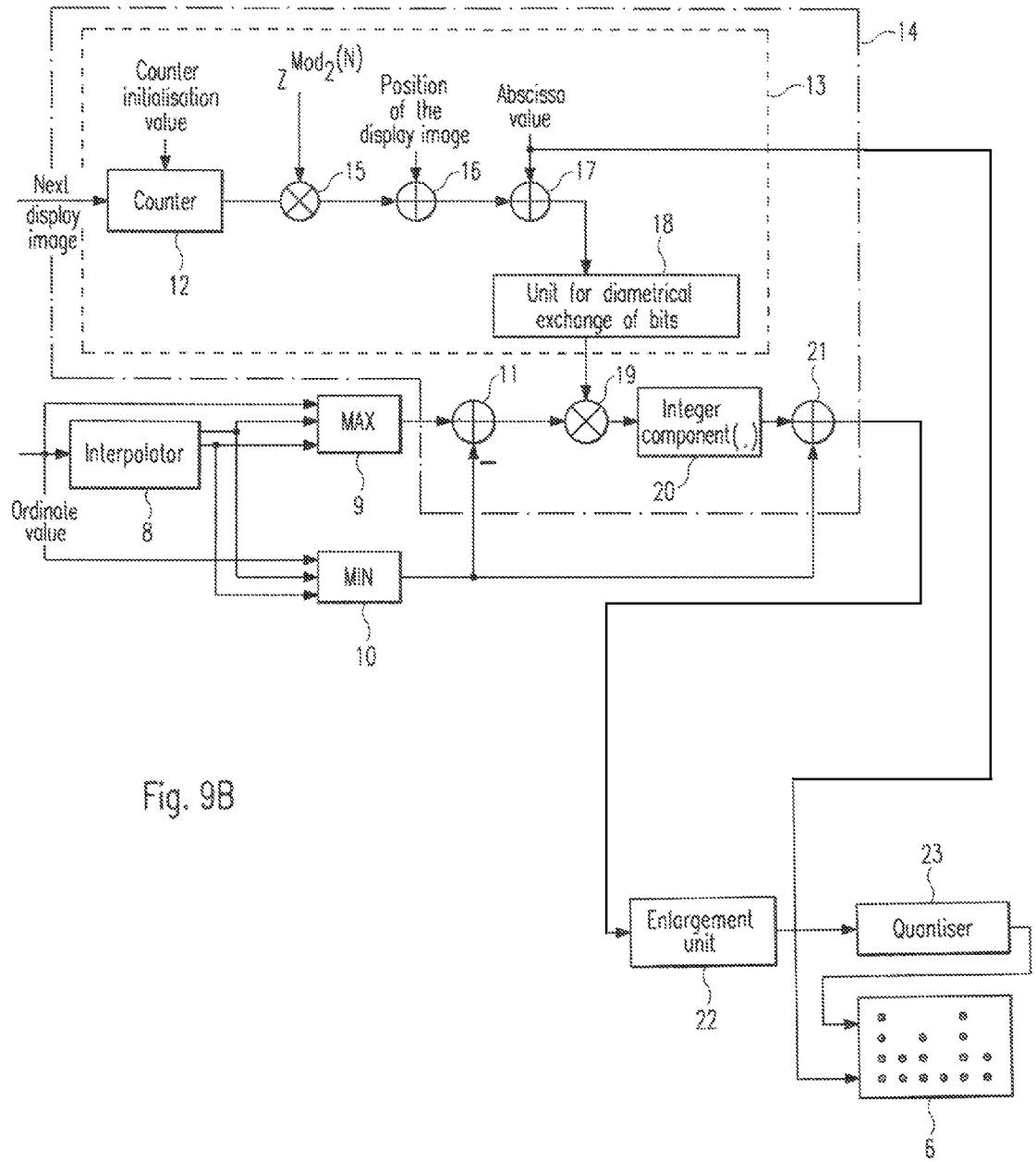
FIG. 9B illustrates a block-circuit diagram of a second apparatus for displaying ordinate-abscissa value pairs on a display device, according to example embodiments of the present invention.

In accordance with example embodiments of the present invention, the following provides a description, with reference to the flowchart in FIG. 8, of a process for displaying ordinate-abscissa value pairs on a display device, and, with reference to FIGS. 9A and 9B, two corresponding embodiments of an apparatus for displaying ordinate-abscissa value pairs on a display device.

Figure 1:
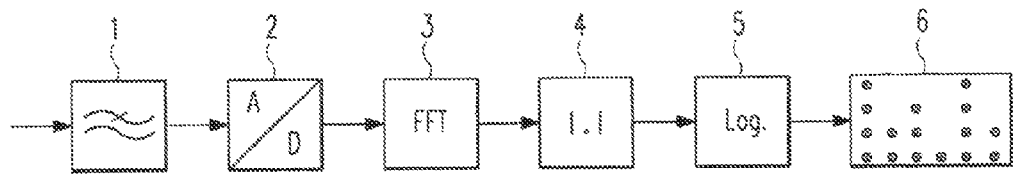
FIG. 1 illustrates a block-circuit diagram of a spectrum analyzer.
Figure 2:
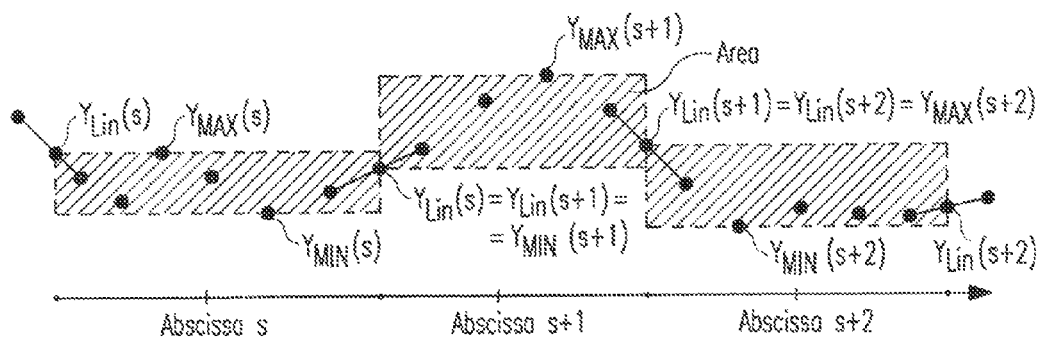
FIG. 2 illustrates a two-dimensional ordinate-abscissa display of ordinate-abscissa value pairs.
Figure 4:
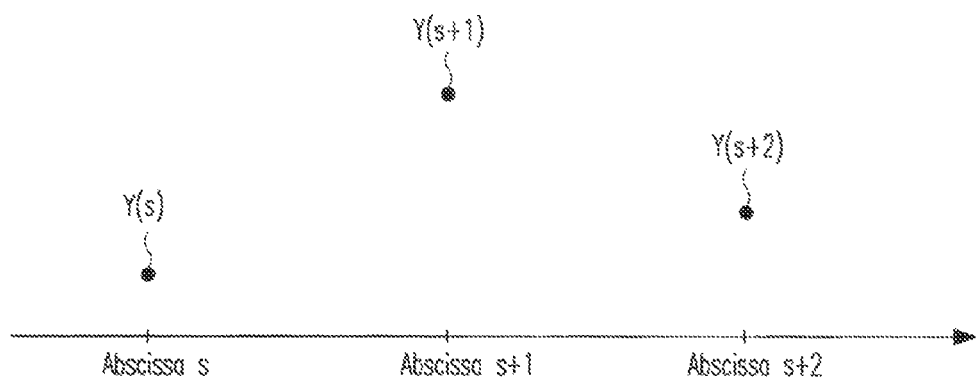
FIG. 4 illustrates an ordinate-abscissa dot display of ordinate-abscissa value pairs.

In the first method step S10, the individual ordinate-abscissa value pairs of the measured signal are registered by means of a measuring device, as was described above with reference to the device shown in FIG. 1, for example, a spectrum analyzer. The individual ordinate-abscissa value pairs are typically stored in an acquisition buffer or screen buffer. If several display images are registered sequentially, processed in parallel and presented in a single screen display, for example, the spectra of a measured signal registered at individual times as a spectrogram or as a histogram in a three-dimensional display, an adequate memory capacity of the acquisition buffer or screen buffer and a correspondingly high signal-processing power in real-time for the computer unit integrated in the measuring device must be ensured.

Figure 6:
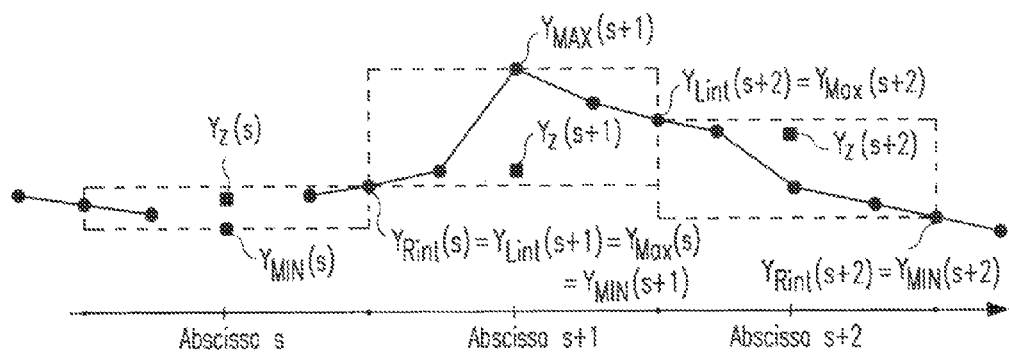
FIG. 6 illustrates an ordinate-abscissa display of ordinate-abscissa value pairs, according to example embodiments of the present invention.

In the next method step S20, the ordinate value positioned on the left and on the right, in each case, at half the spacing from the adjacent abscissa value is calculated in an interpolator 8 for every abscissa value. As shown schematically in FIG. 6 for three abscissa values, the adjacent interpolated ordinate values $Y_{Lint}(s)$, $Y_{Lint}(s+1)$ and $Y_{Lint}(s+2)$ on the left of the individual abscissa values s, s+1, s+2 and the adjacent interpolated ordinate values $Y_{Rint}(s)$, $Y_{Rint}(s+1)$, $Y_{Rint}(s+2)$ on the right of the individual abscissa values s, s+1, s+2 are obtained in this manner.

On the basis of these interpolated ordinate values and the ordinate values measured at each of the individual abscissa values, the maximum ordinate value for every abscissa value is determined in the following method step S30 in a maximum-value former 9 from the measured ordinate value at the respective abscissa value and the two nearest, adjacent interpolated ordinate values on the left and on the right. In an equivalent manner, the minimum ordinate value for each abscissa value is determined in a minimum-value former 10 from the measured ordinate value at the respective abscissa value and the two nearest, adjacent interpolated ordinate values on the left and on the right. As shown in the schematic illustration in FIG. 6, the maximum ordinate values $Y_{MAX}(s)$, $Y_{MAX}(s+1)$ and $Y_{MAX}(s+2)$ and the minimum ordinate values $Y_{MIN}(s)$, $Y_{MIN}(s+1)$, $Y_{MIN}(s+2)$ are accordingly obtained for the individual abscissa values s, s+1, s+2.

In a subtractor 11 adjoining the maximum-value former 9 and the minimum-value former 10, which is associated with a superordinate unit 14 for selecting a random or pseudo-random ordinate value, the difference between the maximum ordinate value and the minimum ordinate value is determined in the next method step S40 for every individual abscissa value.

In the following method step S50, a counter 12, which is associated with a superordinate unit 13 for determining a random or pseudo-random scaling factor and with a superordinate unit 14 for selecting a random or pseudo-random ordinate value and which is initialized at the start of a measurement with a counter initialization value, is incremented in each case by a factor of one for the signal processing of all ordinate-abscissa value pairs which are processed for a single display image.

In the next method step S60, which is implemented only in the second embodiment of a device according to the invention for displaying ordinate-abscissa value pairs on a display device illustrated in the FIG. 9B, the counter status of the counter 12 is read out and multiplied in a second multiplier 15, which is also associated with a superordinate unit 13 for determining a random or pseudo-random scaling factor and with a superordinate unit 14 for selecting a random or pseudo-random ordinate-value pair, by a factor $2^{Log-2(N)}$. The factor log-2(N) is the log-2 value of the number N of sequentially registered signal characteristics processed in parallel for display in a display image, whereas N represents a power of two. The counter status of the counter 12 is accordingly displaced to the left by a number of displacement steps corresponding to the log-2 value of the number N of signal characteristics processed in parallel. As an alternative, a shift register can also be used instead of a multiplier 15.

After the displacement of the counter status to the left, in the same method step S60, in a third adder connected downstream of the second multiplier 15, which is also associated with a superordinate unit 13 for determining a random or pseudo-random scaling factor and with a superordinate unit 14 for selecting a random or pseudo-random ordinate value, a value corresponding to the position of the signal characteristic in the sequence of sequentially registered signal characteristics processed in parallel is added to the counter status displaced to the left in the bit positions which have become free on the right as a result of the left displacement of the data word containing the counter status. If the number N of signal characteristics processed in parallel is not a power of two, the multiplier 15 is not used, and the third adder 16 adds the value N to the counter status read out for every individual signal characteristic.

In both cases, a specific data word is subsequently generated in this manner for every individual signal characteristic illustrated in a single display image, from which, in each case, a specific scaling factor is subsequently generated for every individual signal characteristic displayed in a single display image.

In the next method step S70, which is again implemented in an identical manner in both embodiments of the device according to the invention, the respective abscissa value is added in a second adder 17, which is associated with the superordinate unit 13 for determining a random or pseudo-random scaling factor and with the superordinate unit 14 for selecting a random or pseudo-random ordinate value, to the counter status read out, as shown in FIG. 9A, or respectively, to the counter status read out and corrected by the position of the respective signal characteristic, as shown in FIG. 9B. In this manner, a specific data word is generated in each case for every individual abscissa value, from which, a specific scaling factor is subsequently generated respectively for every individual abscissa value.

The combination of method steps S60 and S70 results, in each case, in a specific data word for every abscissa value, and at the same time, for every signal characteristic illustrated in a single display image, from which a specific scaling factor is subsequently generated, in each case, for every abscissa value, and at the same time, for every signal characteristic illustrated in a single display image.

In the next method step S80, the individual bits of the counter status of the counter 12 modified in the preceding signal-processing stages are exchanged diametrically in a unit 18 for the diametrical exchange of bits following the second adder 17, which is also associated with the superordinate unit 13 for determining a random or pseudo-random scaling factor and with the superordinate unit 14 for selecting a random or pseudo-random ordinate value. In this manner, for example, the original first bit of the data word containing the modified counter status is deposited in the last bit position and the original last bit of the data word containing the modified counter status is deposited in the first bit position. While two successive, original data words, which relate to two adjacent abscissa values or to two directly successive signal characteristics in the display image, differ from one another in each case only by the value 1, the associated data words generated from these data words by the diametrical bit exchange differ from one another by a larger value and accordingly provide scaling factors, which are scattered considerably from one another and accordingly represent pseudo-random scaling factors.

Instead of the unit 18 for the diametrical exchange of bits, a feedback shift register can also be used as an alternative, which generates a pseudo-random scaling factor at its output dependent upon the data word containing the modified counter status and disposed at its input. Finally, a unit which generates a random value by exploiting a stochastic physical effect, for example, by exploiting the stochastic thermal noise of a semiconductor transistor or a semiconductor diode integrated in this unit, can also be used as an alternative to the unit 18 for the diametrical exchange of bits. If a new data word containing a modified counter status is set up at the input of such a unit, a new random value which can be used as a random scaling factor is generated at the output of this unit.

In the next method step S90, the difference determined in each case for an abscissa value between the maximum ordinate value and the minimum ordinate value is multiplied by the pseudo-random scaling factor generated for the associated abscissa value in the unit 18 for the diametrical exchange of bits in a first multiplier 19 adjoining the subtractor 11, which is also associated with the superordinate unit 14 for selecting a random or pseudo-random ordinate value.

In the same method step S90, in a unit 20 for the formation of an integer component adjoining the first multiplier 19, which is also associated with the superordinate unit 14 for selecting a random or pseudo-random ordinate value, the fractional component present in the multiplication result is removed in order to achieve an integer ordinate value.

Finally, in the same method step S90, the minimum ordinate value associated with the respective abscissa value is added to the integer multiplication result in a first adder 21 adjoining the unit 20 for the formation of an integer component, which is also associated with the superordinate unit 14 for selecting a random or pseudo-random ordinate value. In this manner, a random or pseudo-random ordinate value is generated, in each case for every individual abscissa value or respectively for every individual signal characteristic shown in a single display image. From the schematic ordinate-abscissa display of FIG. 6, the random or pseudo-random ordinate values $Y_Z(s)$, $Y_Z(s+1)$ and $Y_Z(s+2)$ shown are displayed as filled squares at the individual abscissa values s, s+1, s+2.

The next method step S100, which can be implemented optionally, contains a zoom or enlargement function. For this purpose, in an enlargement unit 22 adjoining the first adder 21, a coherent portion of ordinate abscissa value pairs is selected from all of the ordinate-abscissa value pairs which result from the determined random or pseudo-random ordinate values and the associated abscissa values, while all of the other ordinate-abscissa value pairs are no longer taken into consideration.

In the final method step S110, the random or pseudo-random ordinate values of all of the ordinate-abscissa value pairs used respectively in the non-enlarged operational case, or respectively, the selected ordinate-abscissa value pairs used in the enlarged operational case are converted in an adjacent quantizer 23 into corresponding ordinate values with the ordinate resolution of the display device 6. The ordinate-abscissa value pairs matched to the number of display points of the display device 6 are transmitted to the display device 6 for display after an optional storage in a screen buffer not illustrated in FIG. 9A and respectively 9B.

Figure 3:
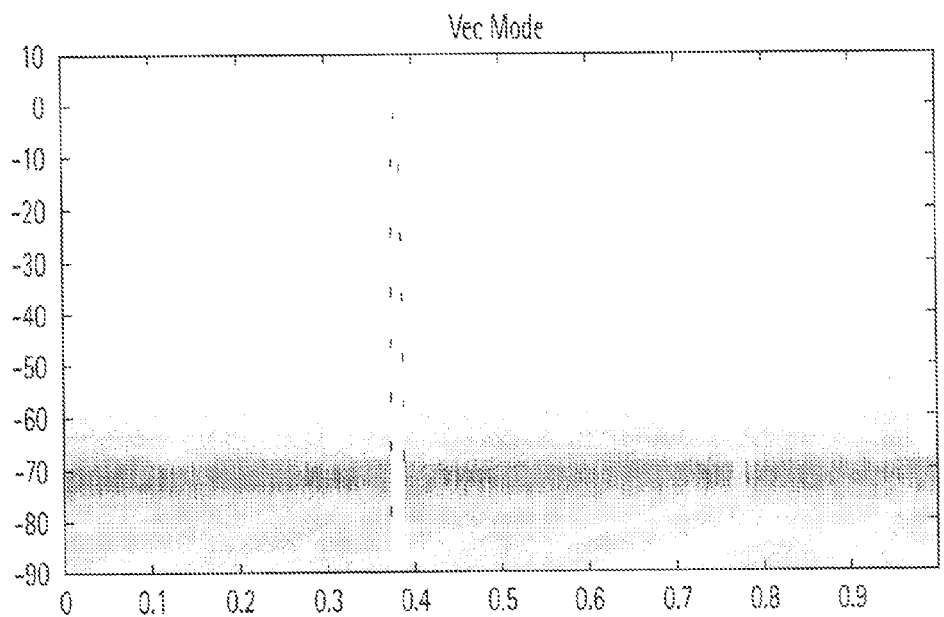
FIG. 3 illustrates a histogram for a two-dimensional ordinate-abscissa display of ordinate-abscissa value pairs.
Figure 5:
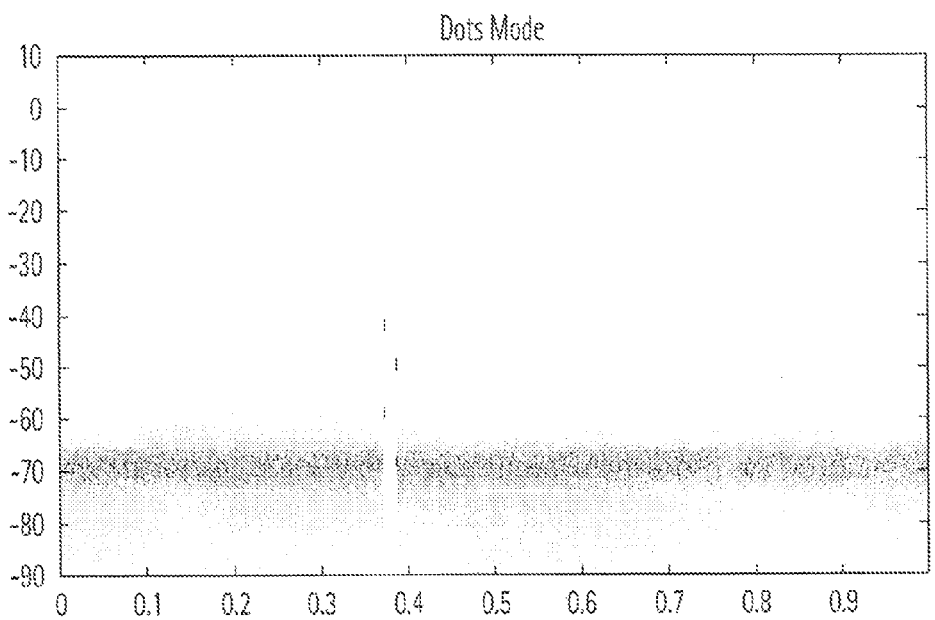
FIG. 5 illustrates a histogram of an ordinate-abscissa dot display of ordinate-abscissa value pairs.
Figure 7:
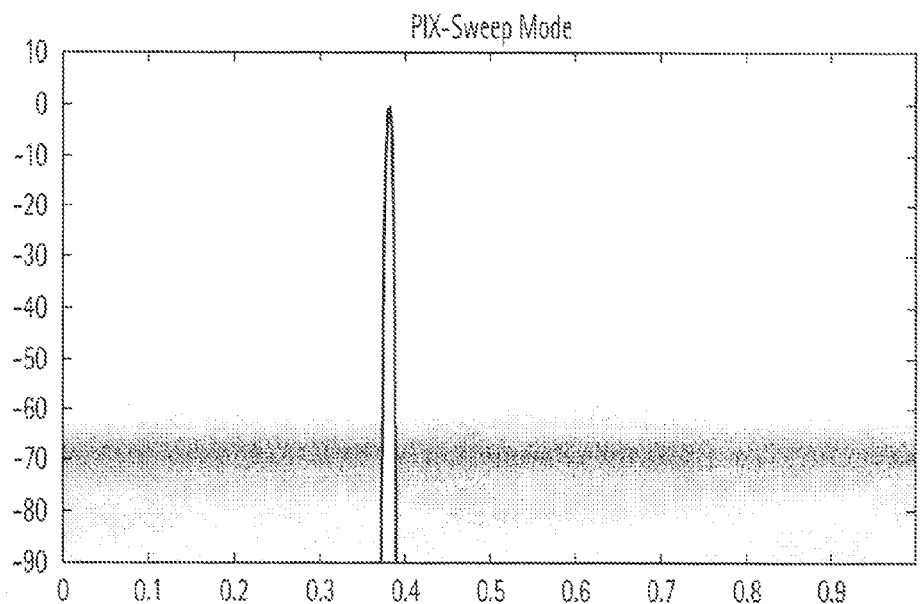
FIG. 7 illustrates a histogram of an ordinate-abscissa display of ordinate-abscissa value pairs, according to example embodiments of the present invention.

By comparison with the histograms in FIGS. 3 and 5, which illustrate the same measured signal with methods and devices according to the prior art, the histogram of a spectrum of a sinusoidal signal with superposed background noise illustrated in FIG. 7, which originates from a method according to example embodiments of the invention as shown in FIG. 8 and is implemented on a device according to example embodiments of the invention as illustrated in FIG. 9A or 9B, provides a significantly clearer display of the singular spectral line at the frequency of the sinusoidal signal. Additionally, by comparison with the illustration according to the prior art in FIG. 3, the maximum frequency of the background noise provides a correct signal level. Moreover, the background noise in the display according to the invention, as shown in FIG. 7, provides a more typical and natural impression than the display according to the prior art from FIG. 3.

The invention is not restricted to the embodiments presented. In particular, any combinations of any of the features claimed in the claims, of any features disclosed in the description and features illustrated in the figures of the drawings are also covered by the invention. The invention is also suitable for displaying different signals, not only from a spectrum but also, for example, from an oscilloscope.

The invention claimed is:

1. A method for displaying a plurality of ordinate-abscissa value pairs via discrete display points in the abscissa direction and the ordinate direction, wherein each ordinate-abscissa value pair comprises an abscissa value and a respective ordinate value, the method comprising:
   determining, by a signal measuring device, an interpolated ordinate value at half abscissa spacing to the left and to the right of each abscissa value;
   determining a maximum ordinate value and a minimum ordinate value for each abscissa value based on the respective ordinate value, and based on the interpolated ordinate value to the left and the interpolated ordinate value to the right of the respective abscissa value; and
   determining a random or pseudo-random ordinate value for each abscissa value between the determined maximum ordinate value and the determined minimum ordinate value for the respective abscissa value,
   wherein an ordinate resolution of the display points is reduced by comparison with
      an ordinate resolution of the ordinate-abscissa value pairs, and
   wherein the determination of the random or pseudo-random ordinate value for each
      abscissa value includes determining an associated random or pseudo-random scaling factor in a value range between zero and one, and multiplying the scaling factor with a difference between the respective maximum ordinate value and the respective minimum ordinate value.

2. The method according to claim 1, wherein the scaling factor for the determination of each random or pseudo-random ordinate value scatters within the value range between zero and one.

3. The method according to claim 1, wherein the determination of the scaling factor, for the determination of the random or pseudo-random ordinate value for each abscissa value, includes incrementing a counter for each random or pseudo-random ordinate value to be determined, adding the associated abscissa value to the counter status, and determining the respective scaling factor by a diametrical exchange of bits of the counter status as increased by the associated abscissa value.

4. The method according to claim 3, wherein the scaling factor for the determination of each random or pseudo-random ordinate value, in each case at an identical abscissa value of the display points between two successive signal characteristics processed and displayed in parallel, scatters within the value range between zero and one.

5. The method according to claim 4, wherein the counter status is displaced to the left by a number of displacement steps corresponding to the log-2 value of a number of signal characteristics processed and displayed in parallel, and a value corresponding to a position of the respective signal characteristic in a sequence of signal characteristics to be processed and displayed in parallel is added to the counter status as displaced to the left.

6. The method according to claim 1, wherein the determination of each random or pseudo-random ordinate value includes adding the associated minimum ordinate value to the difference between the maximum ordinate value and the minimum ordinate value multiplied by the associated random or pseudo-random scaling factor.

7. The method according to claim 6, wherein a range of ordinate-abscissa value pairs reduced in the ordinate direction by comparison with all of the ordinate-abscissa value pairs to be displayed in a display image is selected for the display in the display image.

8. The method according to claim 6, wherein the random or pseudo-random ordinate values of the ordinate-abscissa value pairs are quantized to the ordinate resolution of the display points.

9. A method for displaying a plurality of ordinate-abscissa value pairs via discrete display points in the abscissa direction and the ordinate direction, wherein each ordinate-abscissa value pair comprises an abscissa value and a respective ordinate value, the method comprising:
   determining, by a signal measuring device, an interpolated ordinate value at half abscissa spacing to the left and to the right of each abscissa value;
   determining a maximum ordinate value and a minimum ordinate value for each abscissa value based on the respective ordinate value, and based on the interpolated ordinate value to the left and the interpolated ordinate value to the right of the respective abscissa value; and
   determining a random or pseudo-random ordinate value for each abscissa value between the determined maximum ordinate value and the determined minimum ordinate value for the respective abscissa value,
   wherein an ordinate resolution of the display points is reduced by comparison with an ordinate resolution of the ordinate-abscissa value pairs, and
   wherein a smallest spacing between two random or pseudo-random ordinate values corresponds to a smallest spacing between two ordinate values of the ordinate-abscissa value pairs.

10. An apparatus for displaying a plurality of ordinate-abscissa value pairs via discrete display points in the abscissa direction and the ordinate direction, wherein each ordinate-abscissa value pair comprises an abscissa value and a respective ordinate value, the apparatus comprising:
   an interpolator configured to determine an interpolated ordinate value at half abscissa spacing to the left and to the right of each abscissa value;
   a maximum-value former configured to determine a maximum ordinate value for each abscissa value based on the respective ordinate value and the respective interpolated ordinate value on the left and on the right of the respective abscissa value;
   a minimum-value former configured to determine a minimum ordinate value for each abscissa value based on the respective ordinate value and the respective interpolated ordinate value on the left and on the right of the respective abscissa value; and
   a random value unit configured to determine a random or pseudo-random ordinate
      value for each abscissa value between the determined maximum and minimum ordinate value for the respective abscissa value,
   wherein an ordinate resolution of the display points is reduced by comparison with
      an ordinate resolution of the ordinate-abscissa value pairs, and wherein, for
      the determination of the random or pseudo-random ordinate value for each abscissa value, the random value unit includes a subtractor configured to determine a difference between the maximum and minimum ordinate value, a scale factor unit configured to determine a random or pseudo-random scaling factor, a first multiplier configured to multiply the difference between the maximum and minimum ordinate value by the random or pseudo-random scaling factor, and a first adder configured to add the minimum ordinate value and the difference multiplied by the random or pseudorandom scaling factor,
   wherein the apparatus consists of a signal measuring device.

11. The apparatus according to claim 10, wherein, for the determination of the scaling factor for the determination of the random or pseudo-random ordinate value for each abscissa value, the scale factor unit includes a counter configured to increment a counter status, a second adder configured to add the respective abscissa value to the counter status of the counter, and an exchange unit configured to perform a diametrical exchange of bits of the counter status as increased by the respective abscissa value.

12. The apparatus according to claim 11, wherein the counter status is displaced to the left by a number of displacement steps corresponding to the log-2 value of a number of signal characteristics processed and displayed in parallel, and a value corresponding to a position of the respective signal characteristic in a sequence of signal characteristics to be processed and displayed in parallel is added to the counter status as displaced to the left.

13. The apparatus according to claim 10, further comprising a quantizer configured to map the random or pseudo-random ordinate values determined for each abscissa value onto ordinate values in the ordinate resolution of the display points.

14. The apparatus according to claim 13, further comprising an enlargement unit configured to select a range of ordinate-abscissa value pairs reduced in the ordinate direction by comparison with all of the ordinate-abscissa value pairs to be displayed in a display image.

* * * * *